(12) United States Patent
Murthy et al.

(10) Patent No.: US 7,402,872 B2
(45) Date of Patent: Jul. 22, 2008

(54) METHOD FOR FORMING AN INTEGRATED CIRCUIT

(75) Inventors: Anand S. Murthy, Portland, OR (US); Glenn A. Glass, Beaverton, OR (US); Andrew N. Westmeyer, Beaverton, OR (US); Michael L. Hattendorf, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 11/336,160

(22) Filed: Jan. 20, 2006

(65) Prior Publication Data

US 2006/0131665 A1    Jun. 22, 2006

Related U.S. Application Data

(62) Division of application No. 10/993,865, filed on Nov. 18, 2004, now abandoned.

(51) Int. Cl.
*H01L 29/76* (2006.01)
*H01L 29/94* (2006.01)
*H01L 31/062* (2006.01)
*H01L 31/113* (2006.01)

(52) U.S. Cl. .................. 257/382; 257/408; 257/412

(58) Field of Classification Search .......... 257/368–412
See application file for complete search history.

(56) References Cited

U.S. PATENT DOCUMENTS

| 6,605,498 | B1 | 8/2003 | Murthy et al. |
| 6,621,131 | B2 | 9/2003 | Murthy et al. |
| 6,717,213 | B2 | 4/2004 | Doyle et al. |
| 6,946,350 | B2 | 9/2005 | Lindert et al. |
| 2003/0098479 | A1* | 5/2003 | Murthy et al. ............ 257/288 |
| 2004/0119101 | A1 | 6/2004 | Schrom et al. |
| 2004/0251480 | A1 | 12/2004 | Tolchinsky et al. |
| 2004/0253776 | A1 | 12/2004 | Hoffman et al. |
| 2004/0262683 | A1 | 12/2004 | Bohr et al. |
| 2004/0262692 | A1 | 12/2004 | Hareland et al. |
| 2004/0262694 | A1* | 12/2004 | Chidambaram .......... 257/369 |
| 2005/0019967 | A1 | 1/2005 | Ravi |
| 2005/0064715 | A1 | 3/2005 | Shaheen |
| 2005/0106792 | A1 | 5/2005 | Cea et al. |
| 2006/0076627 | A1* | 4/2006 | Chen et al. .............. 257/369 |

OTHER PUBLICATIONS

U.S. Appl. No. 11/039,197, filed Jan. 18, 2005, Doyle et al.

(Continued)

*Primary Examiner*—Cuong Q Nguyen
(74) *Attorney, Agent, or Firm*—Blakely, Sokoloff, Taylor & Zafman LLP

(57) ABSTRACT

A method is described for manufacturing an n-MOS semiconductor transistor. Recesses are formed in a semiconductor substrate adjacent a gate electrode structure. Silicon is embedded in the recesses via a selective epitaxial growth process. The epitaxial silicon is in-situ alloyed with substitutional carbon and in-situ doped with phosphorus. The silicon-carbon alloy generates a uniaxial tensile strain in the channel region between the source and drain, thereby increasing electron channel mobility and the transistor's drive current. The silicon-carbon alloy decreases external resistances by reducing contact resistance between source/drain and silicide regions and by reducing phosphorous diffusivity, thereby permitting closer placement of the transistor's source/drain and channel regions.

15 Claims, 2 Drawing Sheets

OTHER PUBLICATIONS

Ghani, T. et al., "A 90nm High Volume Manufacturing Logic Technology Featuring Novel 45nm Gate Length Strained Silicon CMOS Transistors", 2003 International Electron Devices Meeting, 3 pages, Dec. 9, 2003.

Thompson, S. et al, "A 90 nm Logic Technology Featuring 50 nm Strained Silicon Channel Transistors, 7 layers of Cu Interconnects, Low k ILD, and 1 $\mu m^2$ SRAM Cell", 2002 International Electron Devices Meeting, pp. 61-64, Dec. 9, 2002.

Lammers, D., "Intel, TI 'Straining' to Improve 90-nm Silicon", EE Times, 3 pages, Oct. 24, 2003.

Moroz, Victor et al., "Analyzing Strained-Silicon Options for Stress-Engineering Transistors," Solid State Technology, Jul. 2004, available at http://sst.pennnet.com/Articles/Article_Display.cfm?Section=ARTCL&ARTICLE_ID=208681&VERSION_NUM=1&p=5.

* cited by examiner

METHOD FOR FORMING AN INTEGRATED CIRCUIT

This is a Divisional application of Ser. No.: 10/993,865 filed Nov. 18, 2004, now abandoned.

FIELD OF THE INVENTION

Embodiments of the present invention relate generally to semiconductor processing and more specifically to methods for forming n-MOS transistors.

BACKGROUND OF THE INVENTION

In silicon (Si) based microelectronics, a key parameter in assessing device performance is the current delivered at a given design voltage. This parameter is commonly referred to as transistor drive current or saturation current ($I_{Dsat}$). Drive current is affected by factors that include the transistor's channel mobility and external resistance.

Channel mobility refers to the mobility of carriers (i.e. holes and electrons) in the transistor's channel region. Increased carrier mobility translates directly into increased drive current at a given design voltage and gate length. Carrier mobility can be increased by straining the channel region's silicon lattice. For n-MOS devices, carrier mobility (i.e. electron mobility) can be enhanced by generating a tensile strain in the transistor's channel region.

Drive current is also influenced by other factors that include: (1) the resistances associated with the ohmic contacts (metal to semiconductor and semiconductor to metal), (2) the resistance within the source/drain region itself, and (3) the resistance of the region between the channel region and the source/drain regions (i.e. the tip region). The sum of these resistances is commonly referred to as the external resistance.

A global approach to increasing n-MOS transistor performance (by generating tensile channel strain) incorporates use of a silicon germanium (SiGe) layer formed over the entire surface of a semiconductor substrate. Epitaxial silicon that is grown on the SiGe layer will strain as it attempts to maintain its silicon crystal structure. Limitations with respect to this approach include: (1) an inability to generate high levels of tensile strain, (2) high dislocation defect densities, (3) the cost and complexity of the SiGe integration scheme, and (4) the production of an offsetting decrease in hole mobility that can degrade p-MOS transistor performance.

Local straining, as compared to global straining, focuses on the optimization of individual transistors by generating a particular type of strain in specific regions of the semiconductor substrate. Current methods for locally straining transistor channel regions include selective epitaxial deposition of source and drain regions with materials that impart a compressive strain in a p-MOS transistor's channel region and deposition of a strained dielectric layer above the gate stack to impart a tensile strain in an underlying n-MOS transistor's channel region.

Figure 1:
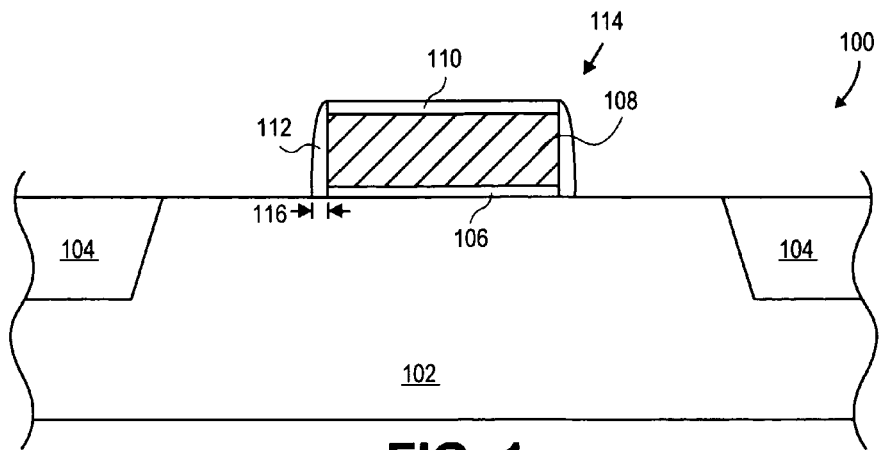
FIG. 1 illustrates a partially formed semiconductor device that includes a gate electrode formed over a semiconductor substrate.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION

In the following detailed description, an n-MOS transistor and its method of formation are disclosed. Reference is made to the accompanying drawings, which form a part hereof, and within which are shown by way of illustration specific embodiments by which the present invention may be practiced. It is to be understood that other embodiments may be utilized and structural changes may be made without departing from the scope and spirit of the present invention.

In one embodiment, recesses are etched in a semiconductor material (such as silicon), and source/drain regions are epitaxially deposited into the recesses. The source/drain regions can include carbon (C), phosphorus (P), or combinations thereof that have been substitutionally incorporated into the epitaxial silicon crystal lattice during the deposition process.

The carbon source for the epitaxial deposition can be a carbon-containing precursor, such as monomethyl silane, and the epitaxial deposition chamber set-point temperature can be in a range from approximately 500° Celsius to approximately 650° Celsius. Under these conditions, carbon can be in-situ substituted into the epitaxial silicon crystal lattice. In one embodiment, carbon is substituted into the silicon crystal lattice at a concentration that exceeds approximately one atomic percent. In an alternative embodiment the carbon is substituted into the silicon crystal lattice at a concentration that exceeds approximately one and one-half atomic percent. Replacement of the silicon with the tensile straining silicon-carbon alloy improves semiconductor device performance by increasing channel carrier mobility.

The in-situ substituted carbon forms a silicon-carbon alloy that has a smaller crystal lattice spacing than would otherwise occur with non-alloyed silicon. The smaller spacing induces a tensile strain in the adjacent channel region of the n-MOS transistor. The tensile strain increases electron mobility in the transistor's channel region and results in an increase in the transistor's drive current.

Carbon incorporated into the silicon crystal lattice using embodiments of the present invention can also impact factors that affect the external resistance of the transistor. Reducing these factors further contributes to improving device performance. For example, the presence of carbon in the source/drain region lowers the electron barrier height between the transistor's salicide region and the source/drain region. The reduction in barrier height translates to reduced contact resistance between the salicide and the source/drain.

The presence of carbon in the source/drain region can also suppress phosphorus diffusion. Suppression of phosphorus diffusion facilitates fabrication of devices with more abrupt source/drain junctions. This allows higher-doped portions of the source/drain regions to be positioned in closer proximity to the channel with less concern of encountering short channel effect and high off-state current leakage problems due to phosphorus out-diffusion. The ability to position the higher-doped portions of the source/drain region closer to the channel region reduces resistance between the two regions. This aspect also makes alternative strategies possible with respect to source/drain tip engineering in that it can be used to eliminate/reduce the need to use source/drain extension implants.

N-type dopants, such as phosphorus (or arsenic) incorporated into the source/drain regions via embodiments of the present invention permits fabrication of source/drain regions that have a higher electrically active phosphorus concentration than is otherwise obtainable using conventional methods. This is due to the non-equilibrium conditions that are possible at the two-dimensional growth surface of an epitaxially deposited film (as compared to implanting into bulk silicon where atoms are constrained three-dimensionally by the silicon crystal lattice). The higher active dopant concentration translates directly into lower resistance within the source/drain regions.

Raising the top surface of the source/drain region above the upper surface of the substrate prior to saliciding can eliminate/reduce problems with salicide pinching and increase drive current. Unlike conventional methods in which consumption of source/drain material during salicide formation can constrict current flow and increase resistance, one embodiment of the present invention teaches raising the top surface of the source/drain regions above the plane of the semiconductor substrate surface, thereby moving source/drain material that is consumed during the salicidation process up and away from the tip region. In this way, reduced or no pinching occurs and the salicide will not interfere with current flow from the channel region into the source/drain regions.

The foregoing embodiments, as well as variations thereof and their benefits may be better understood with respect to FIGS. 1-6 discussed below.

FIG. 1 illustrates a gate electrode structure 114 formed over a semiconductor substrate 102 and between isolation regions 104. The semiconductor substrate can be a bulk silicon substrate, an SOI substrate, or the like. In one embodiment, the semiconductor substrate 102 is a p-type monocrystalline silicon substrate. Isolation regions 104 are formed in or on the substrate 102. The isolation regions 104 can electrically isolate p-type regions from n-well regions as well as n-MOS transistors from each other and p-MOS transistors from each other. Isolation regions 104 can be formed using shallow trench isolation (STI) techniques, LOCal Oxidation of Silicon (LOCOS) techniques, or the like.

A gate dielectric 106 is formed on the upper surface of the substrate 102. The gate dielectric 106 can be a conventional silicon dioxide layer, a high-k dielectric material, or the like. In one embodiment the effective oxide thickness (EOT) of the gate dielectric 106 is in a range of approximately 5-30 Angstroms.

A gate 108 is formed on the gate dielectric 106, and an anti-reflective coat (ARC) 110 is formed on the gate 108. The gate 108 can be formed with polysilicon, or the like, and the ARC 110 can be formed using conventional materials, such as silicon nitride. The deposition and patterning of both the gate electrode 108 and the ARC 110 is conventional to one of ordinary skill. Prior to forming the ARC layer, the polysilicon in the gate 108 can be doped using conventional (i.e., implant or chemical diffusion) processes.

The gate 108 can alternatively be formed from a metal-containing material, such as a pure metal, a metal oxide, a metal nitride, or the like. Metal gates can be formed using deposition and patterning techniques or using inlaid gate processes, as known to one of ordinary skill. In embodiments wherein the gate electrode is metal, the doping process described previously with respect to the polysilicon gate may be unnecessary.

After patterning the ARC 110 and gate 108, spacers 112 are formed adjacent sidewalls of the gate 108 and ARC 110, as shown in FIG. 1. The formation of the spacers 112 is considered conventional. They can be formed from dielectric insulators, such as silicon dioxide, silicon nitride, or silicon carbide. The chemical composition of the spacers can be engineered so as to have specific etch characteristics, or where capacitance is a concern, formed using low dielectric constant materials.

N-type dopants, such as phosphorus or arsenic, can be implanted into the substrate prior to forming spacers 112. This implant is commonly referred to as a tip or source/drain extension implant. It is considered conventional and known to one of ordinary skill. However, as discussed subsequently with respect to FIG. 2, this implant may be optional when using embodiments of the present invention.

Figure 2:
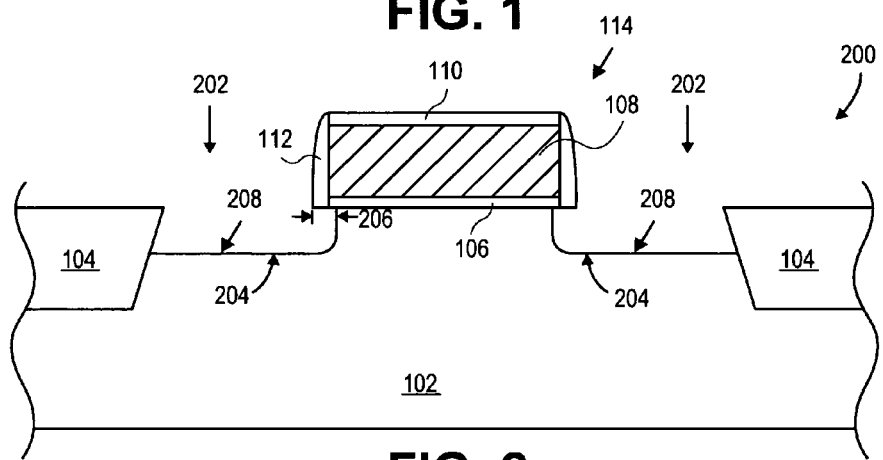
FIG. 2 illustrates the partially formed semiconductor device of FIG. 1 after forming recesses in the semiconductor substrate.

Referring now to FIG. 2, substrate 102 has been etched to form recesses 204. The recesses 204 are formed by patterning a resist and/or hardmask layer to expose substrate regions (i.e. the regions where source/drains are to be formed), and then removing portions of the exposed substrate regions using an etchant 202. Unlike prior art methods, however, which use a pre-spacer source/drain extension implant to define the transistor's tip architecture and an anisotropic etch process so there is no intended lateral undercut below the spacers 112, one embodiment of the present invention intentionally undercuts the spacers 112 by an amount 206 and then fills in the undercut portion of the recess with a doped epitaxial semiconductor material. In one embodiment, the doped epitaxial semiconductor material that occupies the undercut recessed portion forms the transistor's tip region. In this way, depending on the amount of undercut 206 and the thickness of the spacer 116, both of which can impact the proximity of the source/drain region to the channel region, the source/drain extension implant may be optional.

In embodiments where the spacer thickness dimension 116 is relatively small, less lateral undercutting 206 may be necessary to position subsequently formed source/drain regions close to the channel region. To the extent that undercutting can position the source/drain regions and channel regions close enough to each other to form a sufficient current path, the source/drain extension implants may not be necessary. Positioning the source/drain regions too far away from the channel region (either as a result of not enough lateral undercut 206, too large of a spacer dimension 116, or both) not only impacts considerations with respect to source/drain extension implants, it can also reduce the overall beneficial effect that the subsequently formed carbon-doped source/drain region has on channel strain, carrier mobility, and device performance. One of ordinary skill recognizes that a balance of considerations should be made with respect to the tip architecture (i.e., the spacer thickness, the amount of lateral undercut that should be formed, and the presence or lack of source/drain extension regions).

The lateral undercut can be formed by using a conventional silicon wet etch process or a conventional silicon reactive ion etch process having a low or off bias power setting. The low/off bias power setting essentially changes the etch characteristics from an anisotropic etch process that uses a combination of ion bombardment and chemical etching to an isotropic etch process that uses predominantly chemical etching.

In one embodiment, the undercut 206 laterally undercuts spacers 112 beyond the point where the sidewall of the spacer 112 and the sidewall of the gate electrode 108 meet each other and slightly below the gate 108, as shown in FIG. 2. Increasing the undercut beyond this point may additionally improve the transistor's performance (i.e. increase the transistor's drive current). However, it is possible that increasing it too far under gate 108 can also cause problems with short channel effects and high off-state current leakage.

The depth of the recess 204 typically does not exceed the depth of the isolation regions 104. However, this is not necessarily a requirement of the present invention. As shown in FIG. 2, the outer edges of the recesses 204 can be adjacent to the isolation regions 104. The surface 208 exposed within the recess 204 is monocrystalline silicon that has a crystal lattice with a known structure and spacing.

Figure 3:
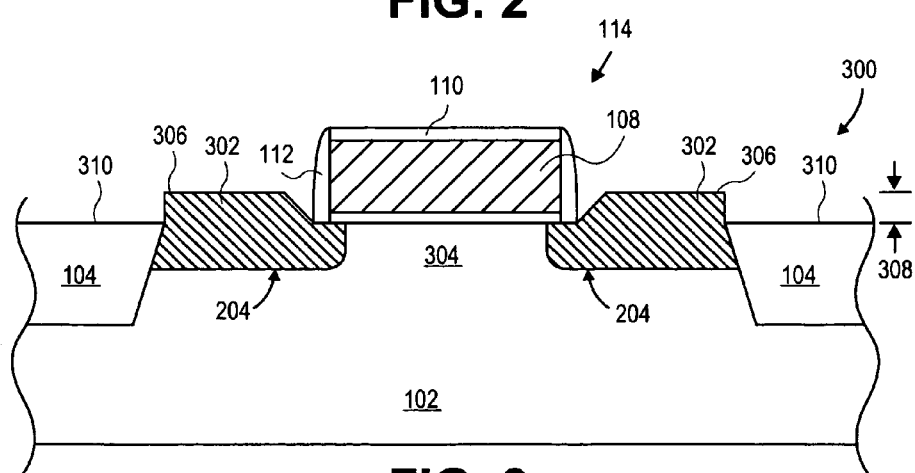
FIG. 3 illustrates the partially formed semiconductor device of FIG. 2 after filling the recesses with an epitaxial semiconductor material.

Referring now to FIG. 3, source/drain regions 302 are formed in the recesses 204. In one embodiment, the source/drain regions 302 are formed using a selective silicon epitaxial growth process that uses silicon, carbon, and phosphorus-containing precursors. In one embodiment, carbon is substitutionally incorporated into the epitaxial silicon crystal lattice at a concentration of greater than one atomic percent, and phosphorus is substitutionally incorporated into the epitaxial silicon crystal lattice at a concentration in a range of approximately 5E19-6E20 atoms/$cm^3$, respectively. In an alternative embodiment, carbon is substitutionally incorporated into the epitaxial silicon crystal lattice at concentrations in a range of 1-2 atomic percent, and phosphorus is substitutionally incorporated into the epitaxial silicon crystal lattice at a concentration in a range of approximately 1-3E20 atoms/$cm^3$, respectively.

The deposition of such a highly doped carbon-phosphorus silicon film can be performed in a low pressure chemical vapor deposition (LPCVD), rapid thermal CVD (RTCVD) or ultra high vacuum CVD (UHV-CVD) process reactor using a deposition/etch sequence that incorporates silane ($SiH_4$) or disilane ($Si_2H_6$), Phosphine ($PH_3$), monomethyl silane ($CH_3SiH_3$), hydrogen ($H_2$), nitrogen ($N_2$) and chlorine ($Cl_2$) chemistries at a set-point temperature in a range of approximately 500-650° Celsius and at a pressure less than approximately 80 Pascals (Pa). In a one embodiment, the pressure is less than 40 Pascals and the temperature is in a range of approximately 550-600° Celsius.

In an exemplary embodiment, using a batch 300 mm LPCVD system (radiatively heated with infra-red coils) with a 100 wafer load size, the following conditions can be used to achieve selective epitaxial growth of silicon that has been in-situ doped to have a phosphorus concentration in a range of 1-3E20 atoms/$cm^3$ and a carbon concentration in a range of 1-2 atomic percent:

| | |
|---|---|
| 1. Number of Deposition/Etch Sequences (One cycle equals one deposition sequence plus one etch sequence) | 175-225 cycles |
| 2. Temperature | 550-625° Celsius |
| 3. Pressure | 15-40 Pascals |
| 4. Epitaxial Deposition (2-5 minutes/cycle) | |
| A. Silane | 250-350 sccm* |
| B. 5% Monomethyl Silane ($CH_3SiH_3$) in nitrogen ($N_2$) | 40-60 sccm |
| C. 5% Phosphine ($PH_3$) in $N_2$ | 3-7 sccm |
| D. Hydrogen ($H_2$) | 1750-2250 sccm |
| 5. Etch (15-60 seconds/cycle) | |
| A. Chlorine ($Cl_2$) | 15-25 sccm |
| B. $N_2$ | 25-35 slm** |
| 6. $N_2$ purge (after each deposition sequence). | |
| 7. $H_2$ Purge (after each etch sequence) | |

*standard cubic centimeter per minute
**standard liters/min

Under these conditions, carbon and phosphorus dopants can be substitutionally incorporated into the silicon crystal lattice at concentrations of approximately 1-2 atomic percent and 1-3E20 atoms/$cm^3$, respectively. The carbon dopant forms an alloy with the silicon, and the phosphorus dopant provides an electrically active species within the alloy. Unlike prior art implant methods, the carbon and phosphorus are substitutionally incorporated into the silicon crystal lattice during the deposition process and the electrically active dopant species (i.e., phosphorous) concentration is essentially equal to the total phosphorus concentration, i.e., 100% activation. In one embodiment, the carbon and phosphorus doped epitaxial silicon film will have a thickness in a range of approximately 1000-3000 Angstroms.

The silicon and carbon form source/drain regions comprising a silicon-carbon alloy having a lattice that has the same crystal structure and in-plane lattice constant as the lattice of the underlying monocrystalline silicon substrate 102. The silicon-carbon alloy lattice, however, has a smaller, out-of-plane spacing as compared to the lattice of the monocrystalline silicon substrate 102. The alloy's smaller spaced lattice and its proximity to the channel region generate a uniaxial tensile strain in the channel region 304 below the gate electrode structure 114.

The tensile strain increases electron mobility and increased electron mobility translates to an increase in drive current. Using embodiments of the present invention, the tensile stress in the channel can increase n-MOS transistor drive current by 10% or more. And, in cases of where the transistor has been initially under-optimized (i.e., under-optimized with respect to tip implant energy and dose, for example) then the gain in transistor drive current can significantly exceed 10%. One of ordinary skill appreciates that increases in drive current can depend on a variety of factors that include the gate length, the spacer width, the degree of lateral undercut, and the substitutional carbon and phosphorus concentrations. In one embodiment, the carbon is present in the combination of silicon and carbon at approximately 1-2 atomic percent.

The in-situ phosphorus doping method described herein has an advantage over prior art implant doping methods in that comparatively relatively large concentrations of phosphorus can be incorporated into the silicon crystal lattice while simultaneously incorporating carbon into the silicon crystal lattice. This not only provides more highly doped source/drain regions (as compared to the prior art), it also reduces the number of manufacturing processing steps required to form the transistor (i.e. it eliminates the need to perform source/drain implants). In one embodiment, the phosphorus concentration can range from approximately 1-3E20 atoms/$cm^3$. At this range of concentrations, the sheet resistivity can range from approximately 2E-3 to 5E-4 Ohm-cm.

Co-doping source/drain epitaxial regions with carbon and phosphorus has also been found to suppress phosphorus diffusion during subsequent high-temperature processes. It is believed that the diffusion of phosphorus, which is normally silicon self-interstitial mediated, is suppressed as a result of carbon's ability to bind with the naturally present interstitial silicon atoms and thereby prevent phosphorus diffusion in the silicon-carbon alloy lattice. Consequently, concentration profiles of source/drain regions formed using embodiments of the present invention are relatively unaffected by exposure to high-temperature processing. This is in contrast to source/drain regions formed using conventional implant methods, where phosphorus diffusion can be on the order of hundreds of Angstroms for a single high-temperature annealing process.

A further advantage of in-situ carbon and phosphorus doping includes the ability to produce more sharply defined junctions as compared using conventional methods. In a sample prepared using an embodiment of the present invention, the post-anneal source/drain phosphorus concentration was observed (via SIMS) to drop from 2E20 atoms/cm$^3$ at a substrate depth of approximately 550 Angstroms to 1E17 atoms/cm$^3$ at a substrate depth of approximately 650 Angstroms. This indicates that the source/drain junction depth was tightly confined to within a range of approximately 550-650 Angstroms into the substrate. This is in contrast the concentration profile from a sample prepared using the conventional implant method, which showed that the post-anneal phosphorus concentration began dropping from 2E20 atoms/cm$^3$ at a depth of approximately 350 Angstroms and still had not reached a concentration of 1E17 atoms/cm$^3$ at a depth of greater than 1000 Angstroms.

The ability to form sharper source/drain junctions as well as the ablilty to suppress phosphorus diffusion allows higher concentrations of phosphorus to be incorporated into the source/drains within laterally recessed portions 206 under the spacers. This can obviate the need for forming conventional ion implanted source/drain extensions in the tip regions. In addition, because more abrupt junctions can be formed and phosphorus diffusion can be suppressed, problems with short channel effects and high off-state current leakage are reduced.

Figure 4:
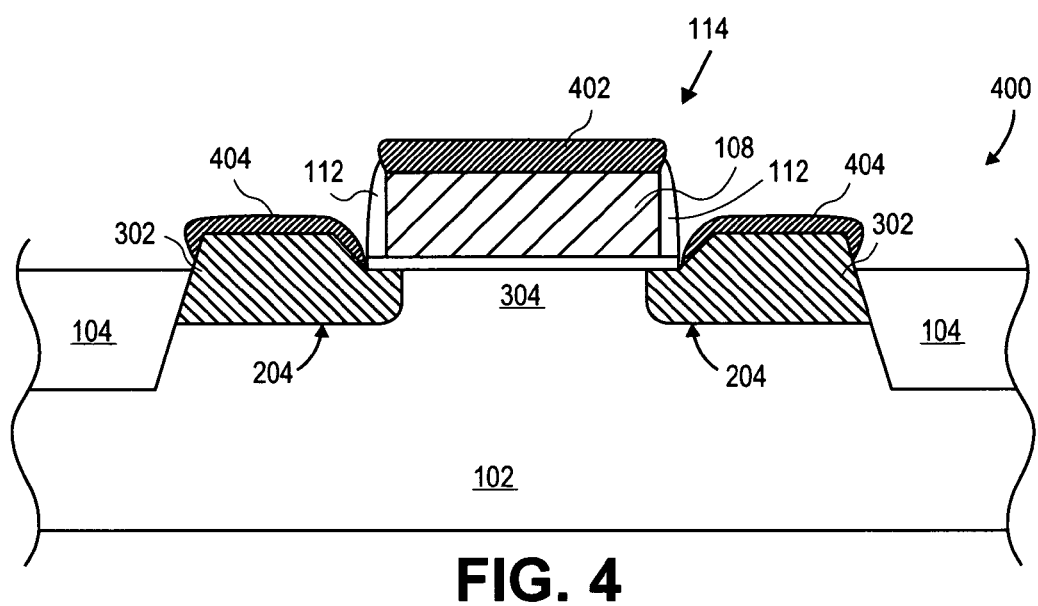
FIG. 4 illustrates the partially formed semiconductor device of FIG. 3 after forming salicide regions over the gate electrode and source and drain regions.

Turning now to FIG. 4, the ARC 110 has been removed using a conventional process, and the surface of the gate electrode 108 and the surface of the source/drain regions 302 have been salicided to form salicide regions 402 and 404, respectively. The salicide can be formed using conventional processing, whereby a metal (such as titanium, tantalum, platinum, molybdenum, cobalt, or the like) is deposited over the structure 400 and then reacted with the exposed silicon areas of the source and drains 302 and polysilicon areas of the gate electrode 108 to form a silicide (such as titanium silicide, tantalum silicide, platinum silicide, molybdenum silicide, cobalt silicide, or the like). The sidewall spacers 108 restrict silicide from forming along sidewalls of the gate electrode 108, thereby preventing electrical shorting between gate electrode and source/drain regions. Following the silicide formation, a selective etch removes unreacted metal without attacking the silicide.

The present inventors have found that by forming source/drain regions that include alloyed substitutional carbon, the barrier height between the source/drain regions 302 and salicide regions 404 can be reduced, thereby reducing contact resistance between the two materials and increasing the drive current of the device. Alternatively stated, alloying the source/drain regions with carbon decreases the conduction band, decreasing the conduction band correspondingly decreases the electron energy barrier (i.e. the difference in the highest level of the conduction band and the vacuum level) such that electrons conducting from the salicide contact can do so with less energy in the carbon doped silicon case than in the pure silicon case.

In one embodiment, the source/drain regions are raised source/drain regions. That is, the upper surface 306 of the source/drain regions are elevated by an amount 308 (shown in FIG. 3) above the surface 310 of the substrate 102. Embodiments that incorporate the raised source/drain architecture additionally eliminate problems with current pinching. In conventional salicide processing, salicide regions are formed by reacting a metal with substrate silicon that is at or below the bottom surface of the gate electrode. This results in consumption of substrate silicon (i.e. source/drain material) during salicide formation. The more substrate silicon that is consumed to form the salicide, the less substrate silicon there is available for passing current between the channel region, through the intermediate tip region, and into the source/drain region. The current flow path from the tip region to the source/drain region is therefore constricted (i.e., "pinched-off") by the presence of the salicide region. And, since the cross-sectional area available for current flow is constricted, resistance is higher than it could be in an unrestricted state. However, by incorporating a raised source/drain architecture, this problem can be reduced or eliminated. Since the silicide is formed in regions of the source/drain above the surface of the semiconductor substrate, there is less constriction of current flow. The transistor's tip region therefore has a broad path for conduction into the source/drain region and current can spread throughout the source/drain region and enter into the salicide contact region through a wide area of source/drain region. Since the silicon-salicide interface typically has relatively high resistivity, increasing the effective contact area can substantially decrease the overall resistance associated with this interface.

Embodiments of the present invention contribute to enhancing drive current in n-MOS transistors and improving transistor short channel effects. The drive current gain can result from (1) the enhanced mobility achieved by the tensile strain imparted on the transistor's channel region by epitaxially formed source/drain regions that have been alloyed with carbon, (2) a low resistivity provided by the ability to dope source/drain regions with high concentration of phosphorus while simultaneously forming the silicon-carbon alloy, (3) reduced contact resistance from barrier height lowering, (4) the ability to suppress phosphorus diffusion, which allows closer placement of the source/drain region to the channel region, thereby resulting in reduced tip resistance, and (5) a raised source/drain architecture, which reduces current pinching resistive losses.

The co-doping of the epitaxial film with phosphorus and carbon suppresses phosphorus diffusion and facilitates the ability to form sharper, more discrete source/drain junctions. Suppressed phosphorus diffusion and sharper source/drain junctions additionally enhances reliability and yield by providing protection against problems associated with short channel effects and high off-state current leakage.

The various implementations described above have been presented by way of example only and not limitation. Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A semiconductor device comprising:
   a gate with spacers over a semiconductor substrate;
   recesses in the semiconductor substrate adjacent the gate, wherein the recesses undercut portions of the spacers; and
   source/drains in the recesses, wherein the source/drains comprise an epitaxial semiconductor material that includes an alloy comprising carbon and silicon, wherein the lattice of the alloy has the same crystal structure and in-plane lattice constant as the lattice of the semiconductor substrate and wherein the alloy has a smaller, out-of-plane spacing than the lattice of the semiconductor substrate.

2. The semiconductor device of claim 1, wherein the carbon is substitutionally incorporated into a crystal lattice of the source drain regions at a concentration greater than approximately 1 atomic percent.

3. The semiconductor device of claim 2 further comprising phosphorus substitutionally incorporated into the source/drain regions, wherein a concentration of phosphorus in the source/drain regions is in a range of approximately 1-3E20 atoms/cm$^3$.

4. A semiconductor device comprising:
a gate with spacers over a semiconductor substrate;
recesses in the semiconductor substrate adjacent the gate, wherein the recesses undercut portions of the spacers; and
source/drains in the recesses, wherein the source/drains comprise an epitaxial semiconductor material that includes an alloy comprising carbon and silicon, and wherein the expitaxial semiconductor material includes phosphorous substitutionally incorporated into the semiconductor material.

5. The semiconductor device of claim 4, wherein the carbon is substitutionally incorporated into a crystal lattice of the source drain regions at a concentration greater than approximately 1 atomic percent.

6. The semiconductor device of claim 4 wherein a concentration of phosphorus in the source/drain regions is in a range of approximately 1-3E20 atoms/cm$^3$.

7. The semiconductor device of claim 4 wherein a depth of the source/drain junction is within a range of about 550-650 Angstroms into the semiconductor substrate.

8. The semiconductor device of claim 4 further comprising a salicide region over the source/drain regions and the gate.

9. The semiconductor device of claim 4 wherein the source/drain regions are raised source/drain regions.

10. The semiconductor device of claim 1 wherein a depth of the source/drain junction is within a range of about 550-650 Angstroms into the semiconductor substrate.

11. The semiconductor device of claim 1 further comprising a salicide region over the source/drain regions and the gate.

12. The semiconductor device of claim 1 wherein the source/drain regions are raised source/drain regions.

13. A semiconductor device comprising:
a gate with spacers over a semiconductor substrate;
recesses in the semiconductor substrate adjacent the gate, wherein the recesses undercut portions of the spacers;
source/drains in the recesses, wherein the source/drains comprise an epitaxial semiconductor material that includes an alloy comprising carbon and silicon, and wherein the expitaxial semiconductor material includes phosphorous substitutionally incorporated into the semiconductor material; and
a silicide over the source/drains.

14. The semiconductor device of claim 13, wherein the carbon is substitutionally incorporated into a crystal lattice of the source drain regions at a concentration greater than approximately 1 atomic percent.

15. The semiconductor device of claim 13 wherein a concentration of phosphorus in the source/drain regions is in a range of approximately 1-3E20 atoms/cm$^3$.

* * * * *